(12) United States Patent
Stöger et al.

(10) Patent No.: US 7,397,307 B2
(45) Date of Patent: Jul. 8, 2008

(54) AMPLIFIER ARRANGEMENT HAVING AN ADJUSTABLE GAIN, AND USE THEREOF

(75) Inventors: Claus Stöger, Linz (AT); Werner Schelmbauer, Linz (AT)

(73) Assignee: Infineon Technologies AG, Munich (DE)

( * ) Notice: Subject to any disclaimer, the term of this patent is extended or adjusted under 35 U.S.C. 154(b) by 133 days.

(21) Appl. No.: 11/240,686

(22) Filed: Sep. 30, 2005

(65) Prior Publication Data

US 2006/0066399 A1    Mar. 30, 2006

(30) Foreign Application Priority Data

Sep. 30, 2004  (DE) .................. 10 2004 047 641
Oct. 18, 2004  (DE) .................. 10 2004 050 643
Aug. 31, 2005  (DE) .................. 10 2005 041 318

(51) Int. Cl.
*H03F 3/45* (2006.01)
(52) U.S. Cl. ................ 330/260; 330/254; 330/85
(58) Field of Classification Search ......... 330/254–261, 330/98–100
See application file for complete search history.

(56) References Cited

U.S. PATENT DOCUMENTS 5,894,245 A    4/1999  Cho 6,373,337 B1    4/2002  Ganser
7,065,336 B2 *  6/2006  Spiegel .................... 455/244.1
7,164,313 B2 *  1/2007  Capofreddi et al. ........... 330/86
7,292,099 B2    11/2007 Stöger et al.

FOREIGN PATENT DOCUMENTS

DE    103 44 878 A1    4/2005

OTHER PUBLICATIONS

"Noise Optimization of an Inductively Degenerated CMOS Low Noise Amplifier", Pietro Andreani and Henrik Sjöland, IEEE Transactions on Circuits and Systems—Analog and Digital Signal Processing, vol. 48, No. 9, Sep. 2001, pp. 835-841.

* cited by examiner

*Primary Examiner*—Robert J. Pascal
*Assistant Examiner*—Hieu Nguyen
(74) *Attorney, Agent, or Firm*—Eshweiler & Associates, LLC

(57) ABSTRACT

According to one or more aspects of the present invention, an amplifier arrangement is disclosed. The arrangement comprises a first, a second and a third amplifier. The first and second amplifiers are coupled to one another such that they form a negative feedback loop. In addition, an output node of the first amplifier is connected to a signal input of the third amplifier. An output node of the third amplifier circuit forms the amplifier output of the amplifier arrangement. In addition, the third amplifier circuit is designed for switchably changing its gain on the basis of a signal at an actuating input of the amplifier arrangement.

17 Claims, 9 Drawing Sheets

AMPLIFIER ARRANGEMENT HAVING AN ADJUSTABLE GAIN, AND USE THEREOF

REFERENCE TO RELATED APPLICATIONS

This application claims the benefit of the priority dates of German applications DE 10 2004 047 641.1, filed on Sep. 30, 2004; DE 10 2004 050 643.4 filed Oct. 18, 2004; and DE 10 2005 041 318.8 filed Aug. 31, 2005, the contents of which are herein incorporated by reference in their entirety

FIELD OF THE INVENTION

One or more aspects of the present invention relate to an amplifier arrangement having an adjustable gain, and to a use for such an amplifier arrangement.

BACKGROUND OF THE INVENTION

In many mobile radio standards, provision is made for the level of the output signal to be altered in order to reduce influences on neighboring subscribers. This requires alteration of a gain factor for the amplifier provided for amplifying the output signal. In addition, a wide bandwidth and also a high level of linearity are demanded in order to meet the needs for increasing data transmission rates. These requirements relate both to the reception path, in which it is necessary to achieve a good signal-to-noise ratio, in particular, and to the transmission path, where the smallest possible distortions in the output signal are of particular importance.

One great problem of all amplifiers implemented to date using complementary MOS technology for mobile radio systems is a large capacitive component of an input impedance. The capacitive component makes matching firmly prescribed source impedances, for example from 100 to 200 ohms for the GSM or the UMTS/WCDMA mobile radio standard, a particularly complex matter. In addition, the filter elements used in mobile radio systems today have the side effect that they convert differentially rejected signals into the DC signal components. In the amplifiers connected downstream of the filters, the DC signal components cause an unwanted compression response and increase data transmission errors as a result of the arising nonlinearities in the useful signal.

It is therefore expedient to produce the greatest possible DC signal component rejection in the amplifier, this also being referred to as "common mode rejection".

One method which is used frequently for compensating for the large capacitive component of the input impedance is inductive coupling. However, a particular problem in this context is a large surface area taken up by the integrated circuit in a semiconductor chip on account of the surface area intensive integration of coils on a silicon base.

An amplifier arrangement which reduces the surface area taken up is known, by way of example, from the German patent application 10 2004 025 918.6 submitted by the applicant.

However, an input impedance of a stage connected downstream of the amplifier arrangement has a significant influence on the input impedance of the amplifier arrangement. Changes in the input impedance of the downstream circuit can therefore require total redesign of the amplifier disclosed in the aforementioned application.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present one or more concepts of the invention in a simplified form as a prelude to the more detailed description that is presented later.

One or more aspects of the present invention pertain to an amplifier arrangement in which the input impedance of the amplifier arrangement is independent of elements connected downstream of the amplifier arrangement, and to a use for such an amplifier arrangement.

According to one or more aspects of the present invention, an amplifier arrangement comprises a signal input for supplying a signal and an amplifier output for outputting an amplified signal. The input of an input amplifier circuit is connected to the signal input, and the input amplifier circuit comprises an output node. The amplifier arrangement has a second amplifier circuit, which is connected to the input amplifier circuit to form a negative feedback loop. Finally, an output stage having a signal input is provided which is connected to the output node. The output stage contains an output which forms the amplifier output of the amplifier arrangement, with the gain setting of the output stage being able to be switchably altered.

According to one or more aspects of the present invention, the amplifier arrangement comprises a first amplifier circuit having a signal input which forms the signal input of the amplifier arrangement. The first amplifier circuit also has an output node. In addition, a second amplifier circuit having a signal input and a signal output is provided which is coupled to the first amplifier circuit such that a negative feedback loop to the first amplifier circuit is formed. A third amplifier circuit has a signal input connected to the output node of the first amplifier circuit. An output of the third amplifier circuit forms the amplifier output of the amplifier arrangement. The gain setting of the amplifier arrangement is configured to be switchable.

According to one or more aspects of the present invention, the provision of a second and of a third differential amplifier circuit separates the circuit functions of impedance transformation and of gain setting, also called "gainstep", from one another. This is done by the additional third differential amplifier circuit with a controllable gain.

According to one or more aspects of the present invention, the negative feedback loop between the first differential amplifier circuit and the second differential amplifier circuit advantageously keeps a loop gain for the inventive amplifier arrangement constant.

According to one or more aspects of the present invention, the input impedance of the inventive amplifier arrangement thus becomes independent of an impedance of a stage which is connected to the output of the amplifier arrangement. In particular, the input impedance of the inventive amplifier arrangement is advantageously essentially dependent on the output impedance of the second differential amplifier circuit.

According to one or more aspects of the present invention, the third differential amplifier circuit is used to produce a gainstep and hence for gain setting between at least two different gains. In particular, the input impedance of the amplifier arrangement advantageously remains independent of this setting. In addition, the separation into an additional third differential amplifier circuit has the advantage that the third stage can produce an additional gain, as a result of which the total gain increases. Overall, a much more precise gainstep is thus provided, a higher level of DC signal rejection and, during production, simpler calibration(s) are obtained.

According to one or more aspects of the present invention, the gain setting may be carried out in different ways. In one example, the third differential amplifier circuit comprises a cascode stage which is designed to have a first cascode transistor pair and a second cascode transistor pair, which is arranged in parallel with the first cascode transistor pair. A control connection of the second cascode transistor pair is coupled to an actuating input of the amplifier arrangement for the purpose of gain setting. In another example, at least one of the first, second and third amplifier circuits is designed to have a differential amplifier circuit.

According to one or more aspects of the present invention, the negative feedback loop in the inventive amplifier arrangement is implemented by virtue of the signal input of the first differential amplifier circuit being connected to the signal output of the second differential amplifier circuit via a complex load. At the same time, the output node of the first differential amplifier circuit is connected to the signal input of the second differential amplifier circuit. By altering the complex load, particularly by altering serial or parallel nonreactive components of the complex load, a real part of the total input impedance is significantly improved.

According to one or more aspects of the present invention, the total input impedance of the arrangement is obtained as a function of the input impedance of the first differential amplifier circuit and the output impedance of the second differential amplifier circuit. The negative feedback loop additionally produces a constant loop gain too.

According to one or more aspects of the present invention, a capacitance is connected between the signal input and the signal output of the second differential amplifier circuit to facilitate improved input impedance and linearity. Preferably, the first and/or the second differential amplifier circuit comprises a transistor pair, with the control connections of the transistor pair forming the signal input of the first and/or second differential amplifier circuit.

According to one or more aspects of the present invention, the third differential amplifier circuit contains a primary amplifier branch having a first amplifier transistor pair and having a third cascode transistor pair, which is connected downstream of the amplifier transistor pair to facilitate an improved gain setting. In this example, the third differential amplifier circuit additionally contains a secondary branch having a second amplifier transistor pair and the cascode stage, where the primary amplifier branch prescribes a predefined gain.

According to one or more aspects of the present invention, switching the cascode stage in the secondary amplifier branch achieves a gain change and hence a gainstep. However, this gain change has no influence on an input impedance of the amplifier arrangement on account of the advantageous logical separation between the impedance transformation and the gain setting.

According to one or more aspects of the present invention, the sink connections of the second cascode transistor pair in the cascode stage are connected to sink connections of the first cascode transistor pair to form a cross coupling arrangement to make a gain setting insensitive toward parasitic influences. This transposes in-antiphase currents and improves the small-signal response of the third differential amplifier circuit when the gain setting is changed over.

According to one or more aspects of the present invention, it is also possible for the signal input of the third differential amplifier circuit and the output node of the first differential amplifier circuit to have an AC coupling arrangement provided between them, which is preferably produced by capacitances.

According to one or more aspects of the present invention, current consumption can be reduced. In one example, a portion of the supply current of the first amplifier circuit is reduced in the second amplifier circuit. During operation the advantages of an impedance transformation and the independence of the input impedance are maintained. Thus, a supply potential input terminal of the second amplifier circuit is coupled to a supply potential terminal of the first amplifier circuit. First and second amplifier circuits are coupled together with a negative feedback loop.

According to one or more aspects of the present invention, a charge storage device for decoupling is provided. The storage device is coupled to the supply potential input terminal of the second amplifier circuit and used in respect to the second amplifier circuit as a virtual ground for the AC voltage portions in the second amplifier circuit. The storage device can be realized as a MOS-cap, or as a stacked MIM-cap. Decoupling elements can be arranged between the outputs of the first amplifier circuit and the signal inputs or gate terminals of this second amplifier circuit. This allows setting the bias of the amplification transistors in the second amplifier stage separately via an additional device.

According to one or more aspects of the present invention, the amplifier output of the circuit arrangement is coupled in a feedback loop with the device for setting the bias of the amplification transistors in the second amplifier circuit. Hence, the linear dynamic system response of the arrangement is improved. The supply potential terminal of the first amplifier circuit can be coupled both to a supply potential input of the second amplifier circuit and a supply potential input of the output circuit. In one example, the output circuit can be implemented as a cascode circuit. By this arrangement, a portion of the reused supply current in the second amplifier circuit is used to provide a constant gain factor for the impedance transformation provided by the negative feedback loop between the first and second amplifier circuit. The remaining portion of the reused supply current is used to generate a very precise gain step in the output circuit.

According to one or more aspects of the present invention, an exemplary amplifier arrangement is provided in a receiver for radio signals as a low noise input amplifier. By setting the gain using at least two different gain factors, it is thus possible to produce an amplified output signal in a suitable and simple manner which has a sufficiently large signal-to-noise ratio. At the same time, the input impedance of the arrangement is independent of a device connected to the output of the arrangement, which means that matching, for example, to an antenna connected to the input, is facilitated. This improves the sensitivity of the overall receiver.

BRIEF DESCRIPTION OF THE DRAWINGS

The invention is explained in more detail below wherein reference is made to the following drawings.

DETAILED DESCRIPTION OF THE INVENTION

Figure 1:
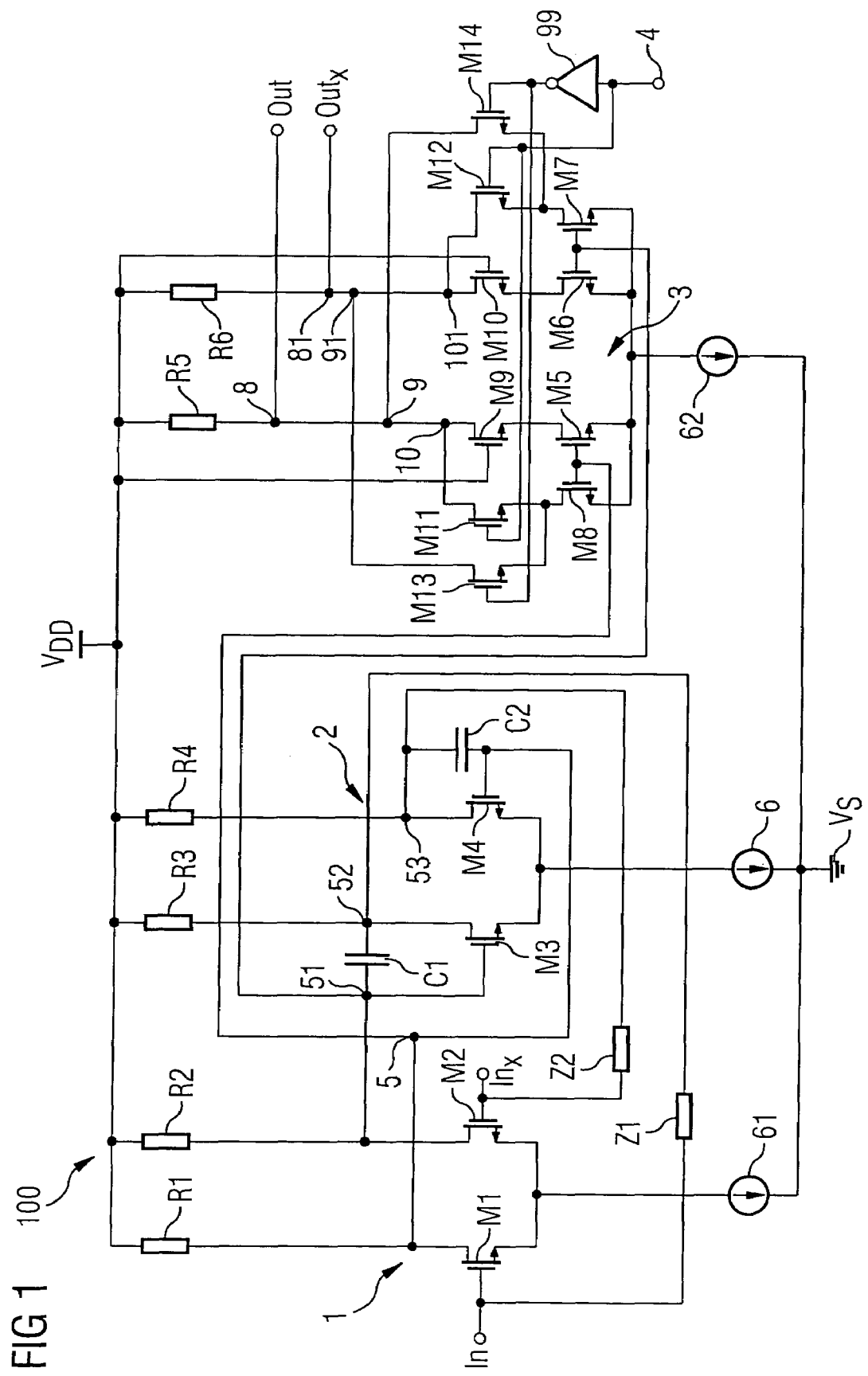
FIG. 1 is a schematic block diagram illustrating an exemplary circuit arrangement according to one or more aspects of the present invention.

One or more aspects of the present invention will now be described with reference to the drawing figures, wherein like reference numerals are used to refer to like elements throughout. It should be understood that the drawing figures and following descriptions are merely illustrative and that they should not be taken in a limiting sense. In the following description, for purposes of explanation, numerous specific details are set forth in order to provide a thorough understanding of the present invention. It will be evident to one skilled in the art, however, that the present invention may be practiced without these specific details. Thus, it will be appreciated that variations of the illustrated systems and methods apart from those illustrated and described herein may exist and that such variations are deemed as falling within the scope of the present invention and the appended claims.

FIG. 1 illustrates a first exemplary embodiment of an inventive amplifier arrangement 100 according to one or more aspects of the present invention comprising three differential amplifiers 1, 2 and 3. The amplifier arrangement 100 is produced in a semiconductor body which has a plurality of connection contacts on the surface for the purpose of supplying signals. Some of these connection contacts are used for supplying a supply potential VDD and a supply current. Other connection contacts on the surface of the semiconductor body are coupled to a ground potential VS. In addition, contacts are provided which form an input In/Inx and an output Out/Outx of the amplifier arrangement for signals which are to be amplified.

The two signal input connections In and Inx are used for supplying a normal mode signal and form the signal inputs of the first differential amplifier 1 of the amplifier arrangement 100. The first differential amplifier 1 is constructed using an amplifier transistor pair comprising the two field effect transistors M1 and M2. The control connection of the first field effect transistor M1 forms the signal input for the signal In, and the control connection of the transistor M2 is designed to supply the normal mode signal Inx. The source connections of the two transistors M1 and M2 are connected to a current source 61 which is connected to the ground potential VS. The drain connections are coupled to the supply potential VDD via two resistors R1 and R2.

Provided between the resistors R1 and R2 and the drain connections of the two transistors M1 and M2 are output taps. These form the output nodes 5 and 51, which also represent the signal inputs of the second differential amplifier 2.

The differential amplifier 2 is constructed in a similar manner to the first differential amplifier 1. It also has a transistor pair comprising two field effect transistors M3 and M4, the source connections of which are coupled to the ground potential VS via a second current source 6. The sink connections of the two field effect transistors M3 and M4 are connected to the supply potential VDD via the resistors R3 and R4.

The output node 5 of the first differential amplifier 1 forms a signal input connection for the differential amplifier 2 and is connected to the control connection of the transistor M4. The output node 51 forms the second signal input connection and is connected to the control connection of the transistor M3. In addition, the differential amplifier 2 contains an output node pair 52 and 53.

The output node 52 is routed via a first capacitor C1 to the output node 51 of the first differential amplifier. At the same time, the output node 52 of the second differential amplifier 2 is routed back via a first complex load Z1 to the signal input for the normal mode signal In of the first differential amplifier.

The output node 53 of the differential amplifier 2 is connected via a second capacitor C2 to the control connection of the transistor M4 and via a second complex load Z2 to the control connection of the transistor M2 in the first differential amplifier 1.

The coupling of the output nodes 5 and 51 of the first differential amplifier 1 to the control connections of the differential amplifier transistors M3 and M4 in the differential amplifier 2 and also the coupling of the output nodes 52 and 53 of the differential amplifier 2 to the control connections of the transistors M1 and M2 result in a negative feedback loop between the differential amplifier 1 and the differential amplifier 2. This negative feedback loop results in transformation of the input impedance, so that the input impedance can be represented as a function of the input impedance of the first differential amplifier, of the impedances Z1 and Z2 and of the output impedance of the second differential amplifier circuit 2.

In one suitable form of the impedances Z1 and Z2, the real part of the total input impedance is increased and the imaginary part is reduced. As a result, the two impedances Z1 and Z2 in combination with the output impedance of the second differential amplifier and the input impedance of the first differential amplifier transform the total input impedance of the inventive amplifier arrangement. It may be expedient for the complex loads to be formed as series or parallel circuits comprising capacitances and resistors. Preferred resistors increase the real part of the total input impedance and thus result in an improvement.

The two capacitors C1 and C2 can be designed to have a regulatable capacitance and allow the gate/drain capacitances of the field effect transistors M3 and M4 in the second differential amplifier to be in variable form. They linearize the second differential amplifier circuit through local feedback and enhance the influence of the impedance of the second differential amplifier circuit on the overall transformation result.

The DC signal component of the first differential amplifier circuit at the output nodes 5 and 51 is additionally used to set the operating point of the transistors M3 and M4 in the second differential amplifier circuit 2.

In addition, the output nodes 5 and 51 are connected to a signal input of a third differential amplifier 3. The third differential amplifier 3 comprises a primary branch comprising a differential amplifier with the transistors M5 and M6, the resistors R5 and R6 and also an interposed cascode circuit comprising the cascode transistors M9 and M10. The source connections of the two amplifier transistors M5 and M6 are again connected to the ground potential VS via a current source 62. The control connection of the transistor M5 is connected to the output node 5, and the control connection of the transistor M6 is connected to the output node 51.

The sink connections of the two transistors M5 and M6 are connected to the source connections of the cascode transistors M9 and M10. The control connections of the two cascode transistors M9 and M10 are routed to the supply potential VDD. They thus bias the cascode transistors with a DC signal. At the output, the primary branch of the differential amplifier 3 contains the nodes 8 and 81, which form the signal output of the amplifier arrangement. The primary branch comprising the amplifier transistor pair M5 and M6 and the cascode transistor pair M9 and M10 has a fixed gain. To alter the gain, a secondary branch is provided.

This secondary branch comprises a second amplifier transistor pair comprising the transistors M7 and M8. The latter's source connections are likewise connected to the current source 62. The control connection of the transistor M7 is connected to the control connection of the transistor M6, and the control connection of the transistor M8 is connected to the control connection of the transistor M5. If the transistors M5 and M8 or M6 and M7 are of the same design, the same gain is achieved for an applied signal in the primary and secondary branches.

The output of the transistor M7 is coupled to a first cascode transistor M12 and to a second cascode transistor M14 arranged in parallel therewith. The drain connection of the cascode transistor M12 is connected to the node 101, and the drain connection of the cascode transistor M14 is routed to the node 9 in the other signal path of the differential amplifier 3. In the same way, two cascode transistors M11 and M13 are also connected to the drain connection of the amplifier transistor M8 in the secondary amplifier branch. The drain connection of the cascode transistor M11 is connected to the node 10, and the cascode transistor M13 is connected to node 91.

The two cascode transistors M13 and M12 in the secondary amplifier branch form a cross coupling arrangement for transposing the currents in antiphase. The control connections of the transistors M13 and M14 are connected to an actuating input of the inventive amplifier arrangement via an inverter 99, and the control connections of the transistors M12 and M11 are connected to the actuating input 4 directly.

A signal at the actuating input turns on one of the two transistors in the secondary amplifier branch M13, M11 or M12, M10. The other is then off on account of the inverted actuating signal.

If the transistors M11 and M12, for example, have been turned on by an appropriate actuating signal at the actuating input 4, the transistors M13 and M14 are off.

The signal amplified in the secondary branch is input into the primary branch again by the nodes 10 and 101 and results in an increased gain at the output nodes 8 and 81. If, by contrast, the transistors M11 and M12 are turned off and the cascode transistors M13 and M14 are turned on, the amplification by the amplifier transistors M7 and M8 in the secondary branch results in a portion of the signal being transposed in antiphase. This reduces the overall gain of the arrangement.

The design with a primary branch having an essentially constant gain and a secondary branch whose gain can be altered allows a gainstep to be provided and hence an amplifier arrangement having two different gain factors which have no influence on the input impedance of the arrangement. By connecting further secondary branches in parallel, it is possible to provide further gain stages. In this case, a gain change on account of a change in the actuating signal at the actuating input 4 does not result in a change in the input impedance of the inventive amplifier arrangement, since the input impedance is independent on account of the feedback network between the differential amplifiers 1 and 2.

Using the proposed amplifier arrangement, separation is thus achieved between the impedance transformation and the gain setting for the amplifier arrangement. In particular, the loop gain between the differential amplifiers in stages 1 and 2 also remains independent of a gain setting at the output. The design with an additional differential amplifier circuit also allows a higher and more precise overall gain. Parasitic effects resulting in a loss of gain can easily be compensated for by altering the resistors R5 and R6.

Figure 2:
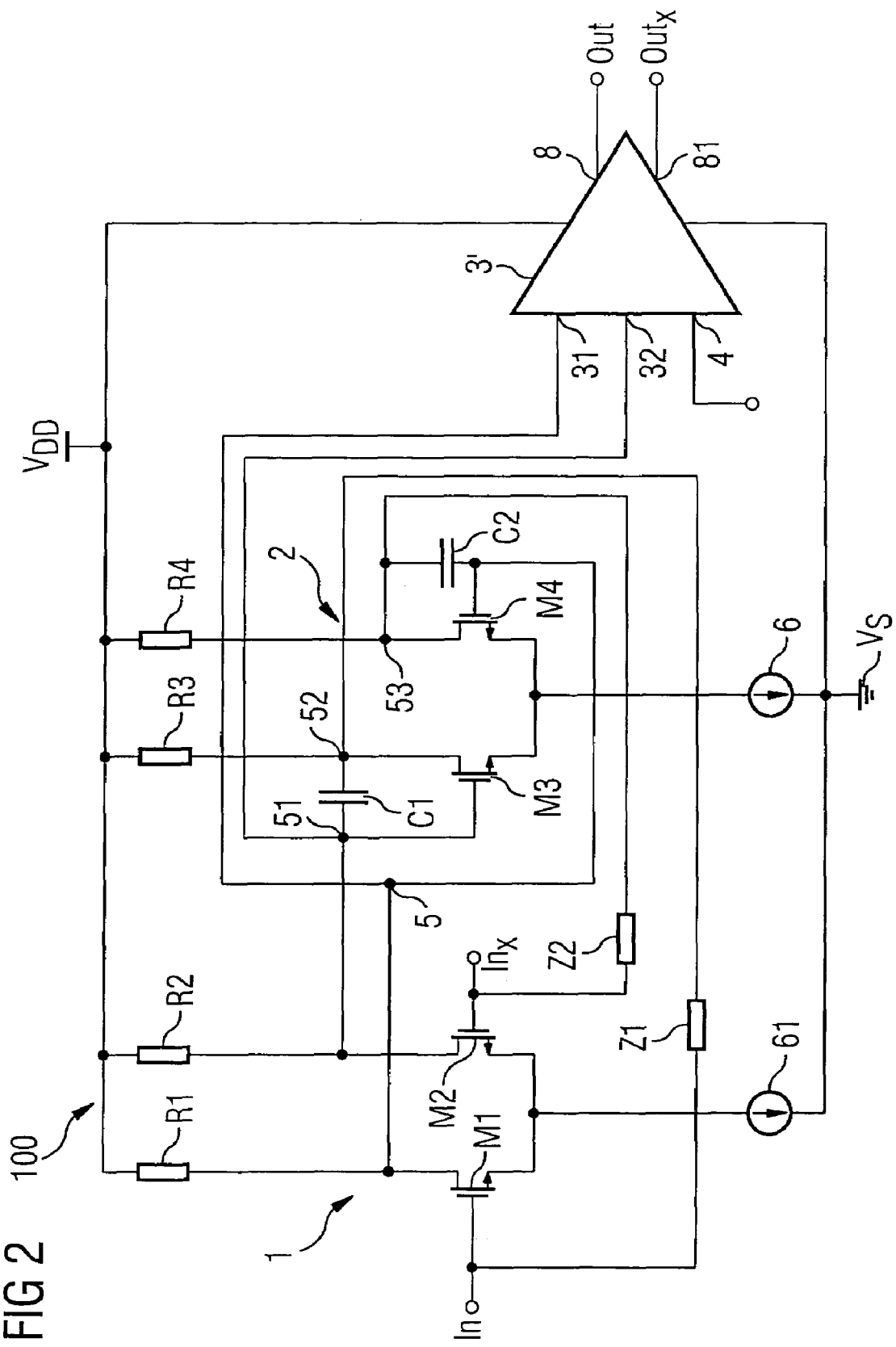
FIG. 2 is a schematic block diagram illustrating an exemplary circuit arrangement according to one or more aspects of the present invention.

In this respect, FIG. 2 illustrates another exemplary circuit arrangement according to one or more aspects of the present invention. Components which have the same action or function bear the same reference symbols. In this example, the two output nodes 5 and 51 are connected to a second differential amplifier circuit 2 and to a third differential amplifier circuit 3', which is connected in parallel therewith. The output of the second differential amplifier circuit 2 is connected to the control connections of the transistors M1 and M2 in the first differential amplifier circuit 1 to form a negative feedback loop.

In this example, the third differential amplifier circuit is in the form of a stage with adjustable gain. For this purpose, it has a control input 4 to which a regulating signal can be supplied. The third differential amplifier stage sets its gain on the basis of this regulating signal. The two outputs then output the amplified differential signal. For power supply, the third differential amplifier circuit is connected between the two potentials VDD and VS. In this case, the gain can be set in different ways. By way of example, parallel signal paths can be switched in or out by means of cascode transistors, as illustrated in FIG. 1. It is likewise possible to regulate the gain using load resistors, that is to say by setting the supply voltage or the supply current for the amplifier transistors in the amplifier circuit.

Figure 3:
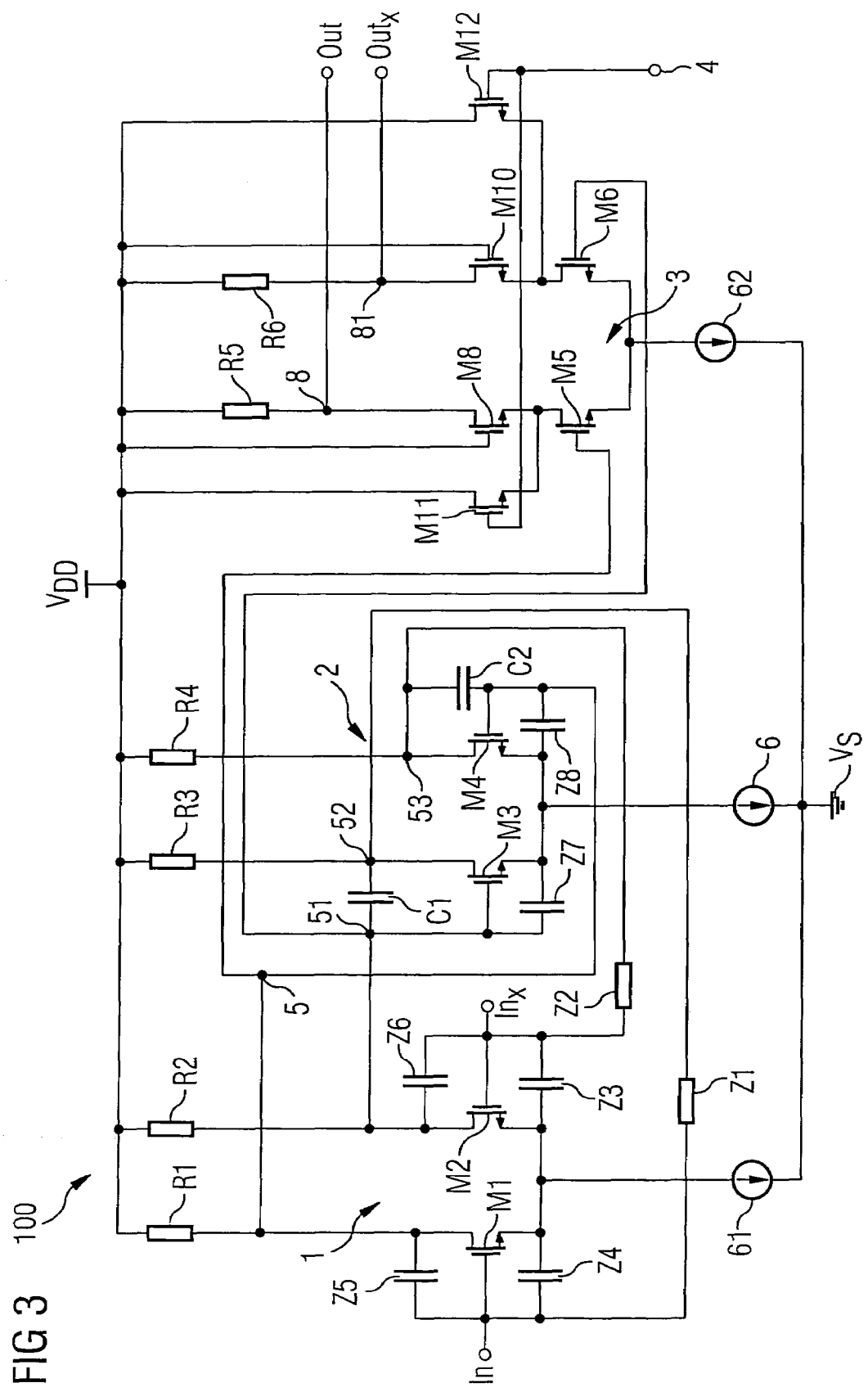
FIG. 3 is a schematic block diagram illustrating an exemplary circuit arrangement according to one or more aspects of the present invention.

FIG. 3 illustrates another exemplary circuit arrangement according to one or more aspects of the present invention. Components which have the same action or function bear the same reference symbols in this case. In this example, respective impedances Z1 and Z2 are connected between the source connections of the differential amplifier transistors M3 and M4 and their control connections. Together with the feedback impedances Z, they increase the linearity of the second differential amplifier circuit and thereby improve the total input impedance of the amplifier arrangement. Similarly, the impedances Z3 to Z6 are connected between the control connections of the transistors M1 and M2 in the differential amplifier circuit 1 and the source and sink connections of the respective transistors.

As a result, the gate/drain and the gate/source capacitances of the amplifier transistors M1 to M4 are in variable form, which improves the linearity both of the first differential amplifier circuit 1 and of the second differential amplifier circuit 2.

The differential amplifier circuit 3 is in a slightly different form than the example in FIG. 1. It too contains a primary branch having a first differential amplifier transistor pair comprising the transistors M5 and M6, whose control connections are connected to the nodes 5 and 51. The drain connections are routed to a first cascode transistor pair comprising the transistors M9 and M10 for the purpose of compensating for the Miller effect in the case of high-frequency signals. In parallel therewith, the third differential amplifier circuit contains a second cascode pair comprising the cascode transistors M11 and M12.

Source connections are connected between the source connections of the first cascode transistor pair and the sink connections of the differential amplifier transistor pair. The control connections are connected directly to the control input 4 of the inventive amplifier arrangement. When the cascode transistors M11 and M12 are turned on by an appropriate actuating signal at the actuating input 4, they discharge a portion of the signal current to the potential VDD. This reduces the gain. The level of the gain stage in this case is determined by the ratio of the small-signal input resistors of the cascodes M11 and M12 relative to M9 and M10.

It is possible to provide an AC coupling arrangement between the output nodes 5 and 51 and the signal inputs of the differential amplifier circuit 3. In such a case, it is necessary to provide operating point regulation for the transistors M5 and M6 in the differential amplifier circuit 3. In the example without AC coupling which has been explained, the DC signal component at the output of the differential amplifier circuit 1 forms the signal component for setting an operating point for the differential amplifier circuits 2 and 3. In the example illustrated in FIG. 3, the capacitances C1 and C2 and also Z1 to Z6 are in the form of capacitors. Similarly, varactor diodes or similar elements which have a capacitance are conceivable here.

Figure 4:
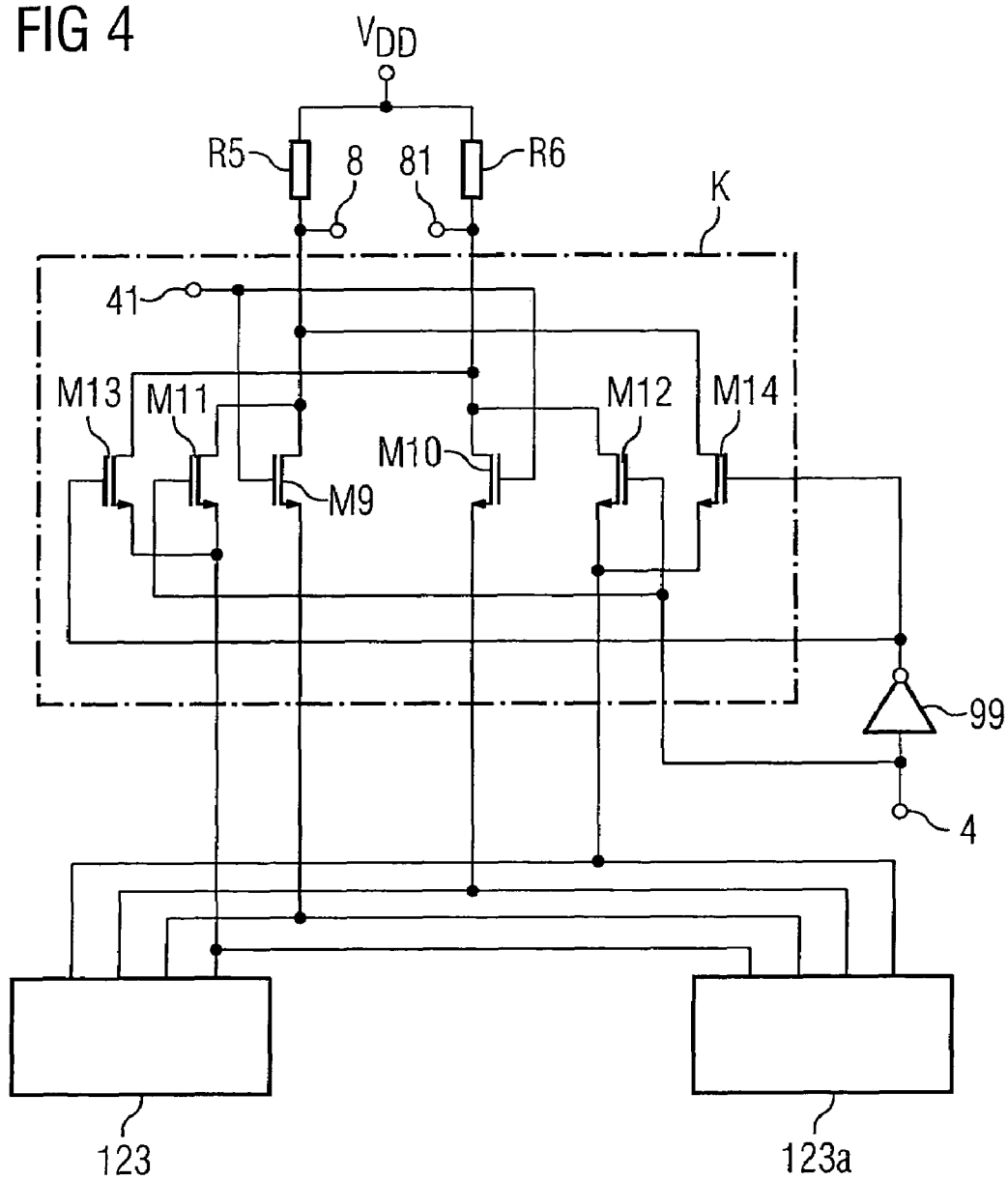
FIG. 4 is a schematic block diagram illustrating an exemplary circuit arrangement according to one or more aspects of the present invention.

A further example of a circuit arrangement according to one or more aspects of the present invention is illustrated in FIG. 4. The differential amplifier circuit 3 is divided and separated into an amplifying region comprising the amplifier transistors M5 and M6 and into the cascode stage K. Specifically, this allows a plurality of inventive amplifier arrangements comprising the differential amplifier circuits 1 and 2 and the amplifying region of the differential amplifier circuit 3 to be interconnected to produce individual modules 123. These are interconnected at the point of lowest impedance in the cascode K.

This reduces a parasitic influence on account of the interconnection to a minimum and a plurality of amplifier paths, for example for different frequency ranges or mobile radio standards, can be implemented in parallel. In the indicated example, the cascode stage K additionally comprises a control input 41 for supplying a signal for setting the operating point of the two cascode transistors M9 and M10 in the primary path.

The examples illustrated in FIGS. 1 to 4 can be combined in any way. It is thus possible to transpose the signal currents in the cascode stage K as indicated in FIGS. 1 and 3, but at the same time to use just one amplifier transistor pair. Besides being produced using field effect transistors, bipolar transistors can also be used in one or more implementations. This allows the surface area and power consumption to be reduced on account of a bipolar transistor having a steeper gradient than a field effect transistor.

Instead of the nonreactive resistors R1 to R2 being used as loads for the differential amplifiers 1 to 3, it is also possible to use current mirrors, which each represent a load.

Figure 5:
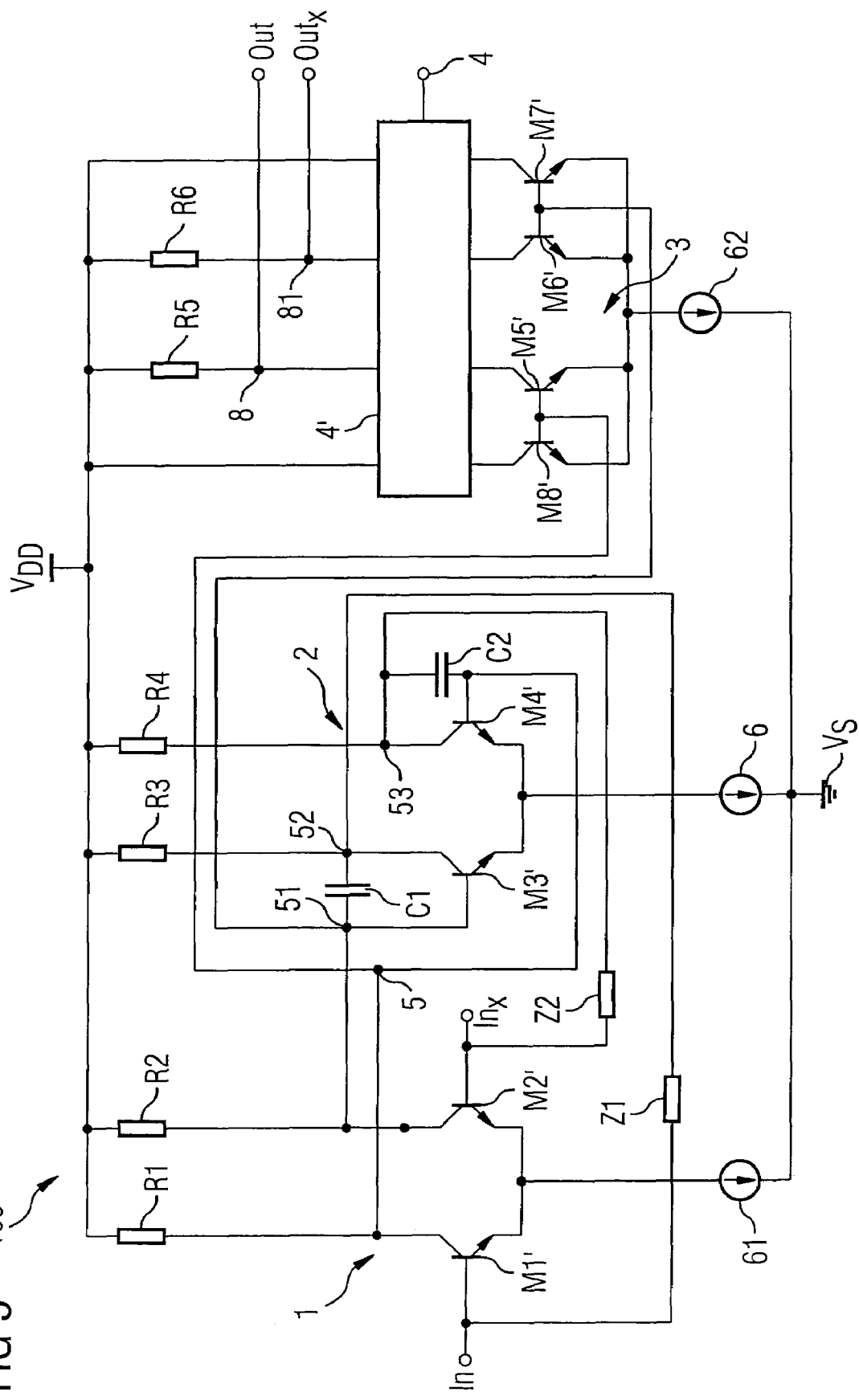
FIG. 5 is a schematic block diagram illustrating an exemplary circuit arrangement according to one or more aspects of the present invention.

FIG. 5 illustrates an exemplary circuit arrangement according to one or more aspects of the present inventions in which the transistors are formed using bipolar transistors. Components which have the same action or function bear the same reference symbols in this case too. Unlike in the preceding examples, the amplifier circuits in this case are formed using bipolar transistors. In particular, the output node 5 of the first differential amplifier circuit is coupled to two transistors M8' and M5' in a third differential amplifier circuit. Correspondingly, the output node 51 is connected to the control connections of the bipolar transistors M6' and M7'. In this example, the transistors M5' to M8' have the same geometric dimensions. They can also have different dimensions, however, and these result in differences in the current carrying capacity and hence gain. The collectors of the transistors M5' to M8' in the third amplifier circuit 3 are connected to a selection circuit 4'. This is used to set the gain by virtue of its coupling the individual transistors, for example, to the output nodes 8 and 81. This is done on the basis of a regulating signal supplied at the control input 4.

According to one or more aspects of the present invention, the current consumption can be reduced without interfering with amplification or the signal quality of the amplified signal. Particularly, the high amplification and precise gain step should remain independent of the input impedance of the amplifier arrangement.

Reduced current consumption can be reduced by re-using a portion of the supply current fed to the first amplifier stage as a supply for the second amplifier stage. Thus the first and the second amplifier stage are not only coupled with each other for the purpose of forming a negative feedback loop, but the second amplifier circuit is also connected to a common current source via the first circuit. Henceforth, the common nodes between the amplifier transistors of the second amplifier stage are connected to the supply terminal of the first amplifier stage. The dedicated coupling between the first and the second amplifier stage facilitates a reduction in current consumption of up to 50%. At the same time the advantages of having an independent input impedance, high amplification gain and sufficient linearity remains.

Figure 9:
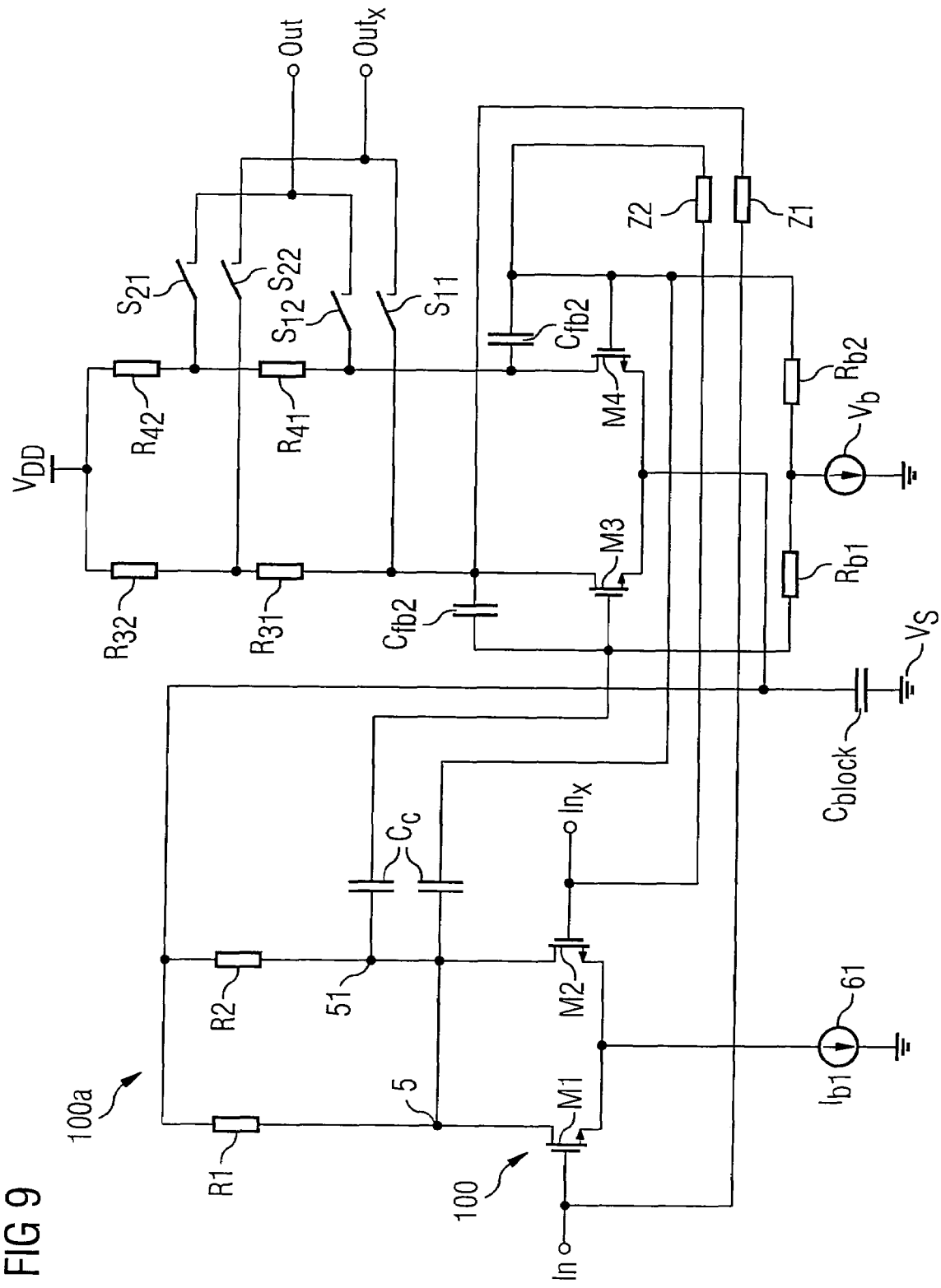
FIG. 9 is a schematic block diagram illustrating an exemplary circuit arrangement according to one or more aspects of the present invention, where the arrangement may comprise a modification to the arrangement depicted in FIG. 8.
Figure 10:
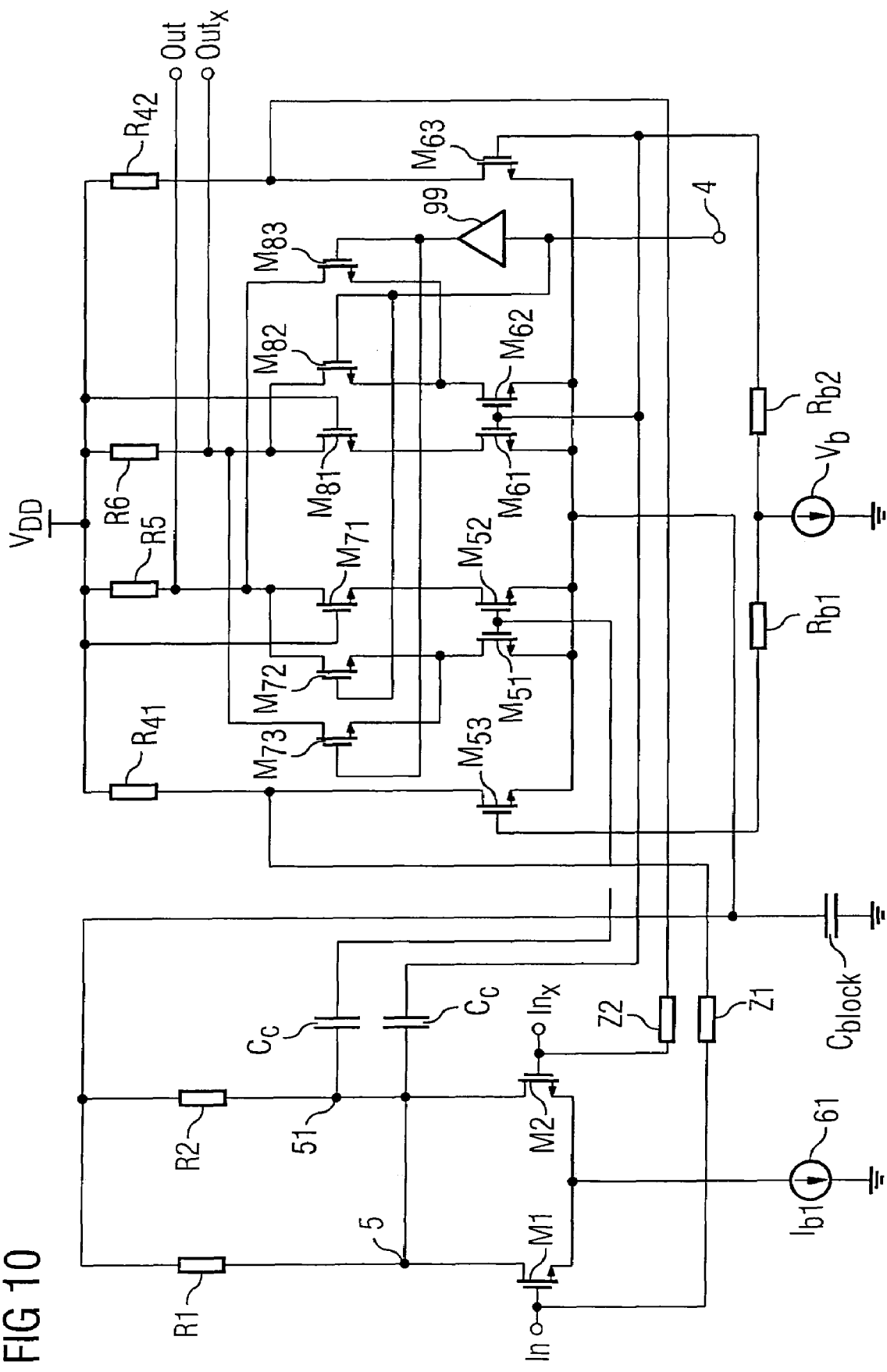
FIG. 10 is a schematic block diagram illustrating an exemplary circuit arrangement according to one or more aspects of the present invention.

FIG. 9 illustrates an exemplary arrangement wherein current consumption can be reduced. Components which have the same action or function bear the same reference symbols. The first amplification stage 100 is adopted as a differential amplifier having two n-channel field effect transistors M1, M2. The gate terminals of both transistors M1, M2 are connected via two impedances Z1, Z2 to the output terminals of a second differential amplifier stage, thereby forming a negative feedback loop. This arrangement corresponds to the negative feedback loop in the embodiments according to FIG. 1 or FIG. 2.

For the purpose of re-using the portion of the supply current of the first amplifier stage 100 in the second amplifier stage, the source terminals of both field effect transistors M3, M4 of the second amplifier stage are connected to a common node but are not coupled to a normal current source. Moreover, the node is connected via capacitor $C_{Block}$ to the ground potential terminal $V_S$. The capacitor $C_{Block}$ comprises a sufficiently high dimensioned capacitance and forms a virtual ground adverse to the AC voltage portion of the signal in the second amplifier stage.

Furthermore, the source terminals of the transistors M3, M4 are connected to the resistors R1, R2 of the first differential amplifier. Thus, the DC portion of the supply current of the first differential amplifier, which is provided by the DC current source 61, is also used in the second differential amplifier. By further decoupling and setting the bias of both field effect transistors M3, M4 in the second differential amplifier, the additional bias voltage source $V_B$ is provided. The voltage source $V_B$ is connected to the gate terminals of the transistors M3, M4 via a first resistor $R_{b1}$ and a second transistor $R_{b2}$. For decoupling the bias voltage, decoupling capacitors $C_C$ are provided. The gate terminals of transistors R3, R4 of the second differential amplifier are attached to the output of the first differential amplifier stage 100 via both capacitors $C_C$. This arrangement is necessary to decouple the DC bias voltage portion of the transistors M3, M4 from the output terminals of the first amplifier stage 100.

The impedance transformation by the negative feedback loop between the first and the second amplifier stage will remain, wherein additional effects of the coupling capacitors $C_C$ have to be taken into account. As seen in the embodiment according to FIG. 3, a further linearization can be achieved by providing additional capacitors between the gate source and the gate drain sections of transistors M1 to M4.

The amplified signals of the second amplifier stage are tapped on different terminals for realizing the gain step and changing the total amplification gain. For this purpose, the switches S11, S12, S22 and S21 are provided. The switch S11 is connected to a node between the drain terminal of transistor M3 and a first resistor $R_{31}$. The switch S21 is connected to a node between the drain terminal of the transistor M4 and a second resistor $R_{41}$. A third resistor $R_{32}$ is coupled to the second terminal of resistor $R_{31}$ via a further node. The resistor $R_{41}$ is coupled to the resistor $R_{42}$ accordingly. The nodes are coupled to the switches S21 and S22 respectively. Different amplification of the output signals and the gain step can be realized by selectively triggering one of those switches pairs.

Due to the high requirements on linearity of the present arrangement a higher supply voltage is provided for concurrently supplying first and second differential amplifiers. For applications having a lower supply voltage the embodiment according to FIG. 5 can be modified.

Figure 8:
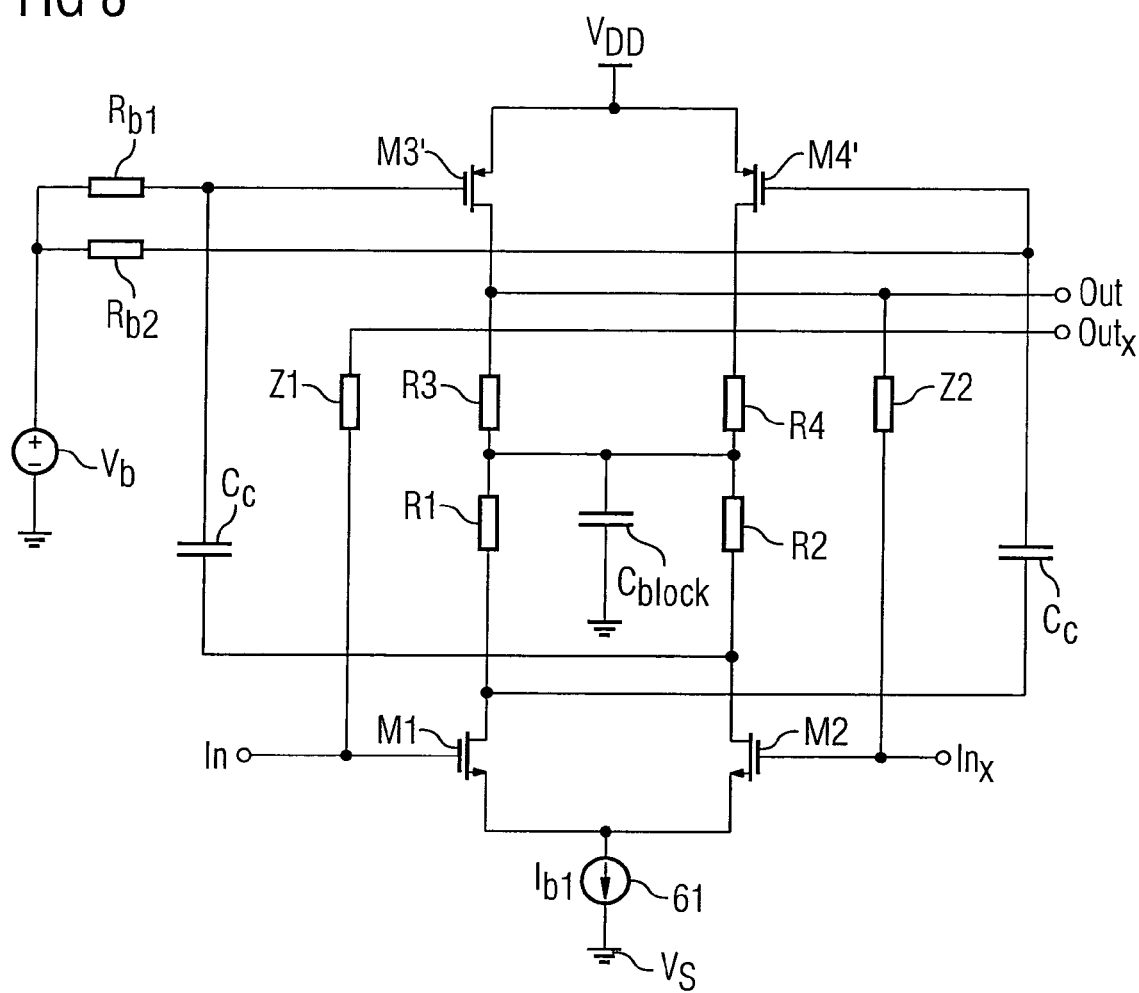
FIG. 8 is a schematic block diagram illustrating an exemplary circuit arrangement according to one or more aspects of the present invention.

FIG. 8 illustrates such modification usable for applications having a lower supply voltage and higher linearity requirements respectively. In this example the transistors M3, M4 of the second amplifier stage are implemented using p-channel field effect transistor. The transistor M3 is connected to the drain terminal of transistor M1 of the first amplifier stage via the in series coupled resistors R3, R1. The transistor M4 of the second amplifier stage is attached to the drain terminal of transistor M2 via the resistors R4, R2 accordingly. Between the resistors R3, R1 and R4, R2 respectively nodes are provided, connected to the capacitor $C_{Block}$, which is in turn connected to the ground terminal. The capacitor $C_{Block}$ acts as a virtual ground.

In this example, the total gain is not switched. However, it is possible, to provide an additional amplifier stage and decouple this amplifier stage with the output terminals OUT, OUTX.

Figure 7:
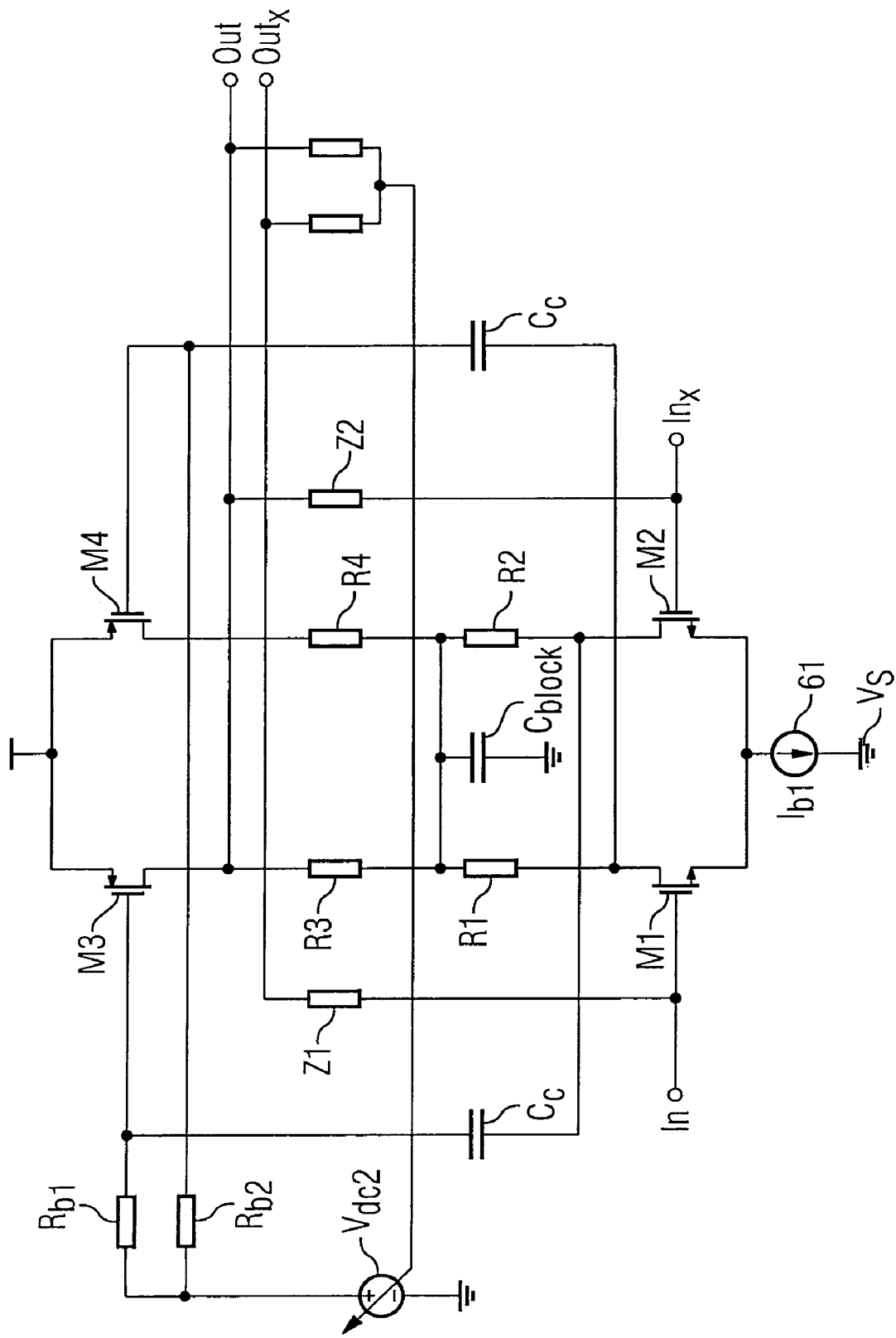
FIG. 7 is a schematic block diagram illustrating an exemplary circuit arrangement according to one or more aspects of the present invention.

A further feature is illustrated in FIG. 7, where the amplification factor and current gain at equal amplification gain respectively can be achieved by providing a feedback loop of the amplified output signal at the outputs OUT1, OUT2 to the bias voltage source $V_{G2}$ of the second differential amplifier.

Figure 6:
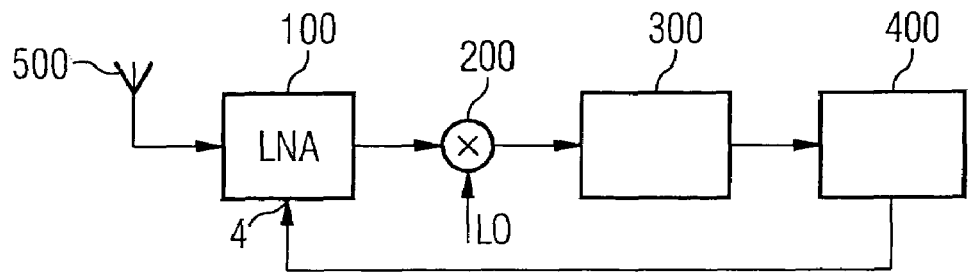
FIG. 6 is a schematic block diagram illustrating an exemplary circuit arrangement according to one or more aspects of the present invention.

An exemplary arrangement is illustrated in FIG. 6, where a very precise amplification gain factor using the additional cascode amplifier stage is achieved. As well as in the previous example, a common node of the source terminals of transistors $M_{53}$, $M_{63}$ of the second amplifier stage as well as the transistors $M_{51}$, $M_{52}$ and $M_{51}$, $M_{62}$ Of the cascode stage is coupled to the terminals of resistors R1, R2 of the first amplifier stage. In operation a portion of the reused current in the second amplifier stage, comprising the transistors $M_{53}$, $M_{63}$ is used to provide a constant gain for the impendence transformation between the first amplifier stage and the second amplifier stage. The remaining portion of the DC current is used to realize a very precise gain step within the cascode stage.

Accordingly, DC current can be reduced by up to 50% while maintaining the input impedance during switching the gain factor.

It will be appreciated that the examples illustrated can also be combined. It is thus entirely possible to implement the amplifier circuit using BiCMOS technology. Some amplifier circuits are thus formed using field effect transistors and others using bipolar technology.

The inventive amplifier arrangement can be used both for reception paths, and in that case with particular preference as a low noise input amplifier, and in the transmission path. An example of such a use is illustrated in FIG. 6. In this figure, the input of the inventive amplifier arrangement is connected to an antenna 500. The independence of the inventive amplifier arrangement's input impedance means that it is possible to match the impedances of the antenna and the amplifier arrangement so as to obtain as few signal reflections as possible. The output of the amplifier arrangement 100 is connected to the input of a mixer 200. The amplified output signal is converted to an intermediate frequency or, depending on the mixer, to baseband and is processed further in the downstream elements 300 and 400.

In the present case, the circuit 400 contains a control device which is coupled to the control input 4 of the amplifier arrangement. This performs gain setting for the arrangement 100. This may be dependent on the output level of the signal which is output by the arrangement 100, for example. When the input level of the signal coming from the antenna is very high, the high gain of the arrangement 100 and the associated high signal output level can result in nonlinear effects in the mixer 200 or in the circuit 300. The level of the output signal from the amplifier arrangement is therefore expediently measured. If the level exceeds a threshold value, the gain is reduced by an appropriate control signal.

Although the invention has been illustrated and described with respect to a certain aspect or various aspects, it is obvious that equivalent alterations and modifications will occur to others skilled in the art upon the reading and understanding of this specification and the annexed drawings. In particular regard to the various functions performed by the above described components (e.g., assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several aspects of the invention, such feature may be combined with one or more other features of the other aspects as may be desired and advantageous for any given or particular application. Furthermore, to the extent that the term "includes" is used in either the detailed description or the claims, such term is intended to be inclusive in a manner similar to the term "comprising." Also, exemplary is merely intended to mean an example, rather than the best.

| List of reference symbols | |
| --- | --- |
| 1, 2, 3, 3': | Differential amplifier circuits |
| 4: | Actuating input |
| 5, 51: | Output nodes |
| 6, 61, 62: | Current sources |
| 8, 81: | Output nodes |
| 9, 91, 10, 101: | Switching nodes |
| 99: | Inverter |
| M1, M2, . . ., M7, M8: | Amplifier transistors |
| M9, M10, . . ., M13, M14: | Cascode transistors |
| Z1, Z2: | Feedback impedances |
| C1, C2: | Capacitors |
| R1, R2, . . ., R5, R6: | Resistors |

-continued

| List of reference symbols | |
|---|---|
| Z3, Z4, ..., Z5, Z6: | Impedances |
| VDD: | Supply potential |
| VS: | Ground potential |
| In, Inx: | Signal input |
| Out, Outx: | Signal output |

The invention claimed is:

1. An amplfier arrangement having an adjustable gain, comprising:
a signal input (In, Inx) for supplying a signal,
an amplifier output (Out, Outx) for outputting an amplified signal;
a first amplifier circuit, whose input is connected to the signal input and which comprises an output node;
a second amplifier circuit, which is connected to the first amplifier circuit to form a negative feedback loop;
an output circuit having a signal input which is connected to the output node and having an output which forms the amplifier output (Out, Outx) of the amplifier arrangement, the output circuit being designed such that its gain can be selected between at least two gain settings, wherein at least one of:
the output circuit comprises of a switchable cascode stage (K) for changing the gain,
the signal input of the first amplifier circuit is coupled to the signal output of the second amplifier circuit via a complex load, and the at least one output node is connected to the signal input of the second amplifier circuit,
the signal input of the second amplifier circuit is connected to the signal output of the second amplifier circuit via a charge store (C1, C2),
the first amplifier circuit comprises a supply potential terminal, which is coupled to a supply potential input of the second amplifier circuit for re-using a portion of a supply current fed to the first amplifier circuit,
the first amplifier circuit is arranged between a supply input and a supply output, said supply input connected to a current source, and the second amplifier circuit comprises a supply input connected to the supply output of the first amplifier circuit,
the output circuit comprises a input terminal coupled to a supply output terminal of the first amplifier circuit for re-using a portion of a supply current fed to the first amplifier circuit, and
the output circuit has a primary amplifier branch having a first amplifier transistor pair (M5, M6) and having a cascode transistor pair (M9, M10), which is connected downstream of the first amplifier transistor pair (M5, M6), and also has a secondary branch having a second amplifier transistor pair (M8, M7) and the cascode stage (K).

2. The amplifier arrangement of claim 1, wherein at least one of the first and second amplifier circuits and the output curcuit comprises a differential amplifier circuit.

3. The amplifier arrangement of claim 1, wherein the cascode stage (K) comprises a first cascode transistor pair (M11, M12) and a second cascode transistor pair (M13, M14), which is arranged in parallel with the first cascode transistor pair (M11, M12), and an actuating connection of the second cascode transistor pair (M13, M14) is coupled to the actuating input of the amplifier arrangement to facilitate gain setting.

4. The amplifier arrangement of claim 1, wherein at least one of the first amplifier circuit and the second amplifier circuit comprises a transitor pair (M1, M2, M3, M4) with control connectons of the transistor pair (M1, M2, M3, M4) forming the signal input of at least one of the first and second differential amplifier circuits.

5. The amplifier arrangment of claim 3, wherein the second cascode transistor pair (M13, M14) in the cascode stage (K) has sink connections connected to sink connections of the first cascode transistor pair (M12, M11) to form a cross coupling arrangement.

6. The amplifier arrangement of claim 3, wherein the first cascode transistor pair (M11, M12) comprises a second actuating connection, which is designed to supply a setting signal which is the inverse of a setting signal supplied to the actuating connection of the second cascode transistor pair (M13, M14).

7. The amplifier arrangement of claim 6, wherein an inverter coupled to the actuating input of the amplifier arrangement is provided whose output is connected either to the first actuating connection or to the second actuating connection.

8. The amplifier arrangement of claim 1, wherein the casscode stage (K) comprises field effect transistors.

9. The use of the amplifier arrangement of claim 1 in a receiver arrangement for radio signals, the amplifier arrangement being connected downstream of an antenna and being used as an input amplifier having an adjustable gain.

10. An amplifier arrangement having an adjustable gain, comprising:
a signal input (In, Inx) for supplying a signal, an amplifier output (Out, Outx) for outputting an amplified signal and an acuating input for supplying a setting signal;
a first differential amplifier curcuit having two connections for a signal which form the signal input (In, Inx) of the amplifier arrangement and having two output nodes;
a second differential amplifier circuit having two input connections which are respectively coupled to one of the output nodes and having two output nodes which are coupled to the two connections of the first differential amplifier circuit;
a third differential amplifier circuit having a signal input which is connected to the at least one output node and having an output which forms the amplifier output (Out, Outx) of the amplifier arrangement, with the third differential amplifier circuit configured for gain switching.

11. The amplifier arrangement or claim 10, wherein a cascode stage (K) comprises a first cascode transistor pair (M11, M12) and a second cascode transistor pair (M13, M14), which is arranged in parallel with the first cascode transistor pair (M11, M12), and wherein an actuating connection of the second cascode transistor pair (M13, M14), is coupled to the actuating input of the amplifier arrangement to facilitate gain setting.

12. The amplifier arrangement of claim 11, wherein the third differential amplifier circuit has a primary amplifier branch having a first amplifier transistor pair (M5, M6) and having a third cascode transistor pair (M9, M10), which connected downstream of the first amplifier transistor pair (M5, M6), and also has a secondary branch having a second amplifier transistor pair (M8, M7) and the cascode stage (K).

13. The amplifier arrangement of claim 10, wherein each of the first, second and third differential amplifier circuits comprise a first supply terminal and a second supply terminal, wherein the first supply terminal of the first differential amplifier circuit is connected to a current source and the second supply terminal of the first differential amplifier circuit is coupled to the first supply terminal of at least one of the second and third differential amplifier circuits.

14. The amplifier of claim 10, wherein
the first differential amplifier circuit comprises a supply potential terminal, said supply potential terminal coupled to a supply input of the second differential amplifier circuit for re-using a portion of a supply current fed to the first amplifier circuit.

15. The use of the amplifier arrangement of claim 10 in a receiver arrangement for radio signals, the amplifier arrangement being connected downstream of an antenna and being used as an input amplifier having an adjustable gain.

16. An amplifier arrangement having an adjustable gain, comprising:
  signal input (In, Inx) for supplying a normal mode signal, an amplifier output (Out, Outx) for outputting an amplified normal mode signal and an actuating input for supplying a setting signal;
  a first differential amplifier circuit having a signal input which forms the signal input (In, Inx) of the amplifier arrangement and having at least one output node;
  a second differential amplifier circuit having a signal input and a signal output which is coupled to the first differential amplifier circuit in order to form a negative feedback loop;
  a third differential amplifier circuit having a signal input which is connected to the at least one output node and having an output which forms the amplifier output (Out, Outx) of the amplifier arrangement, with the third differential amplifier circuit comprising a cascode stage (K) which comprises a first cascode transistor pair (M11, M12) and a second cascode transistor pair (M13, M14), which is arranged in parallel with the first cascode transistor pair (M11, M12), and an actuating connection of the second cascode transistor pair (M13, M14) being coupled to the actuating input of the amplifier arrangement to facilitate gain setting.

17. The use of the amplifier arrangement of claim 16 in a receiver arrangement for radio signals, the amplifier arrangement being connected downstream of an antenna and being used as an input amplifier having an adjustable gain.

* * * * *